US005317229A

United States Patent [19]

Koehler et al.

[11] Patent Number: 5,317,229

[45] Date of Patent: May 31, 1994

[54] PRESSURE PULSE SOURCE OPERABLE ACCORDING TO THE TRAVELING WAVE PRINCIPLE

[75] Inventors: Georg Koehler, Geisfeld; Ulrich Schaetzle, Erlangen; Arnim Rohwedder, Fuerth; Martin Scheidt, Nuremberg, all of Fed. Rep. of Germany

[73] Assignee: Siemens Aktiengesellschaft, Munich, Fed. Rep. of Germany

[21] Appl. No.: 974,517

[22] Filed: Nov. 12, 1992

[30] Foreign Application Priority Data

Nov. 27, 1991 [DE] Fed. Rep. of Germany ....... 4139024

[51] Int. Cl.[5] ............ H01L 41/08

[52] U.S. Cl. ............ 310/334; 310/335; 310/800; 310/317

[58] Field of Search ............ 310/334-336, 310/317, 800

[56] References Cited

U.S. PATENT DOCUMENTS

| | | | |
|---|---|---|---|
| 2,806,155 | 9/1957 | Rotkin | 310/334 X |
| 3,399,314 | 8/1968 | Phillips | 310/334 |
| 3,872,330 | 3/1975 | Miller et al. | 310/334 |
| 4,354,132 | 10/1982 | Borburgh et al. | 310/334 |
| 4,356,422 | 10/1982 | van Maanen | 310/334 X |
| 4,415,998 | 11/1983 | Blizard | 310/334 X |
| 4,477,783 | 10/1984 | Glenn | 310/334 X |
| 4,526,168 | 7/1985 | Hassler et al. | 128/303 R |
| 4,697,588 | 10/1987 | Reichenberger | 128/328 |
| 4,725,994 | 2/1988 | Kaneko et al. | 310/334 X |
| 5,163,436 | 11/1992 | Saitoh et al. | 310/335 X |

FOREIGN PATENT DOCUMENTS

| | | |
|---|---|---|
| 2351247 | 4/1975 | Fed. Rep. of Germany . |
| 3425992 | 1/1986 | Fed. Rep. of Germany . |
| 3817996 | 12/1989 | Fed. Rep. of Germany . |
| 283077 | 10/1990 | German Democratic Rep. . |
| 1250523 | 9/1968 | United Kingdom . |

*Primary Examiner*—Mark O. Budd

*Attorney, Agent, or Firm*—Hill, Steadman & Simpson

[57] ABSTRACT

A pressure pulse source for generating acoustic pressure pulses in an acoustic propagation medium has a foil arrangement formed by a number of electrically contacted piezoelectric foils stacked directly on top of one another with no interstices between the foils, and employs a drive system for driving the individual foils in succession according to the traveling wave principle.

23 Claims, 2 Drawing Sheets

PRESSURE PULSE SOURCE OPERABLE ACCORDING TO THE TRAVELING WAVE PRINCIPLE

BACKGROUND OF THE INVENTION

1. Field of the Invention

The present invention is directed to a pressure pulse source for generating acoustic pressure pulses in an acoustic propagation medium, and in particular to a pressure pulse source operating according to the traveling wave principle.

2. Description of the Prior Art

Pressure pulse sources can be employed, for example, in medicine for the disintegration of calculi (lithotripsy), for treating tumors and for treating bone pathologies (osteorestoration). Such pressure pulse sources can also be used for non-medical purposes, for example in materials testing. For all uses, the pressure source must be acoustically coupled to the subject to be acoustically irradiated in a suitable manner, in order to ensure a low-loss introduction of the pressure pulses into the subject. The pressure pulse source and the subject must also be aligned relative to each other so that the region of the subject which is to be acoustically irradiated is located in the propagation path of the pressure pulses, or is located in the focal zone of the pressure pulses in the case of focused pressure pulses.

A pressure pulse source for medical purposes operating according to the traveling wave principle is described in German OS 38 17 996. In this pressure pulse source, a plurality of foils are disposed spaced from each other by a defined acoustic propagation path in a liquid acoustic propagation medium disposed between each of the foils. The foils are driven according to the traveling wave principle, which is understood in the art and is used herein to mean that the foil farthest from the acoustic propagation medium is first, separately driven to generate a pressure pulse, and the foil immediately following in the propagation direction of the pressure pulse is then separately driven for generating a pressure pulse when the pressure pulse generated by the first-driven foil reaches that foil, and so on until all of the foils have been driven in succession. This results in a superimposition of the pressure pulses generated by the individual foils, so that the peak amplitude of the wavefront, and thus the pressure associated therewith, is continuously increased.

In the aforementioned German OS 38 17 996, the spacing of the foils, separated by a defined liquid propagation path, is intended to prevent the foils from mutually influencing each other in terms of their frequency behavior. It has been shown that this known pressure pulse source is fundamentally functional, but the pressure magnitude obtainable, even with the use of a large number of foils, is rather low in comparison to known electro-hydraulic sources (of the type described in German OS 23 51 247), known electromagnetic sources (of the type described in European Application 0 188 750, corresponding to U.S. Pat. No. 4,697,588) and piezoelectric pressure pulse sources (of the type described in German OS 34 25 992), which are not operated according to the traveling wave principle.

As is understood by those skilled in the art, and as used herein, the term "foil" means a planar structure having a thickness which does not exceed a few millimeters.

SUMMARY OF THE INVENTION

It is an object of the present invention to provide a pressure pulse source operable according to the traveling wave principle which generates pressure pulses exhibiting a higher pressure than have heretofore been achieved with that type of pressure pulse source.

The above object is achieved in accordance with the principles of the present invention in a pressure pulse source for generating acoustic pressure pulses in an acoustic propagation medium, operable according to the traveling wave principle, having a foil arrangement consisting of a plurality of electrically contacted, piezoelectric foils stacked directly on top of one another with no interstices therebetween, and a drive system for driving the foils according to the traveling wave principle for generating pressure pulses. The invention is based on the perception that liquid propagation paths between the individual piezoelectric foils are not required, as has been heretofore believed. Consequently, the acoustic attenuation caused by the such liquid propagation paths is eliminated, so that pressure pulses having a pressure higher in comparison to those obtainable in the structure described in German OS 38 17 996 can be generated under operating conditions which are otherwise the same (i.e., identical piezoelectric foils with respect to their dimensions and electrical contacting, the same number of piezoelectric foils, and driving the piezoelectric foils with the same electrical signal). As used herein, the phrase "foil arrangement of piezoelectric foils stacked directly on top of one another with no interstices therebetween" is intended to describe foil arrangements having foils which are "loosely" placed on top of one another so that their respective end faces which face toward one another press flush against the adjacent face, as well as foil arrangements wherein the foils are glued to each other at the end faces which face toward each other. In the latter arrangement, the thickness of the individual glue layers is small in comparison to the thickness of the foils and in comparison to the wavelength of the fundamental oscillation of the generated pressure pulses. The electrical contacting of the foils can ensue, for example, by metallizing the respective end faces of the foils.

Although German OS 31 19 295, corresponding to U.S. Pat. No. 4,526,168, discloses a pressure pulse source driveable according to the traveling wave principle, the individual transducers thereof are arranged in succession but are not disposed directly on top of one another. Piezoelectric ultrasound transducers are described in East German Patent 283 077 and British Patent 1 250 523 which are composed of individual transducers stacked directly on top of one another, however, no drive according to the traveling wave principle is used in those systems. On the contrary, the individual transducers are simultaneously driven in order to give the overall ultrasound transducer a behavior which corresponds to that of a single transducer having dimensions coinciding with those of the composite transducer.

In one embodiment of the invention, the foils of the foil arrangement are electrically connected so as to form a plurality of layers, with the layers being driven according to the traveling wave principle and with each layer preferably comprising a plurality of foils. In this embodiment, the end faces of the piezoelectric foils can be provided with an electrode for electrical contacting, and at least one layer is formed by two piezoelectric foils which press against each other with electrodes of the same polarity, and the layers press against other layers with electrodes of the same polarity. In another version of this embodiment, the piezoelectric foils also have their respective end faces provided with an electrode for electrical contacting, but at least one layer is formed by a bilaminarly folded piezoelectric foil, and the layers press against each other at electrodes of the same polarity. In both versions, insulating measures can be eliminated both between the individual piezoelectric foils and between the layers of the foil arrangement, so that acoustic losses caused by such insulating layers, as a consequence of attenuation therein, are avoided. Moreover, the wiring outlay is reduced because in conventional sources operating according to the traveling wave principle, a plurality of electrical lines connecting the foils to the drive circuit corresponding in number to twice the number of piezoelectric foils is needed. In the acoustic source disclosed herein, only a number of such electrical lines equal to the number of piezoelectric foils (or layers), plus one is needed. Moreover, no parasitic capacitances of significance can arise between the piezoelectric foils or layers which are directly adjacent.

Preferably, all of the piezoelectric foils and/or layers of the foil arrangement have the same thickness. This simplifies the drive of piezoelectric foils (or layers), because the respective transit times of a pressure pulse from foil to foil, or from layer to layer, are the same. If such layers or foils of identical thickness are used, in one version of this embodiment the end face of the foil arrangement, which is opposite to the end face from which the pressure pulses emerge from the foil arrangement, is pressed against a backing which is acoustically hard in comparison to the piezoelectric foils. Because, when driven, the piezoelectric foils emit pressure pulses both in the desired propagation direction, toward one end face, an in an opposite direction toward the other end face, the use of the backing results in the pressure pulses emitted in the direction opposite to the desired propagation direction being reflected in-phase, with proper operational sign, at the backing. Given continuing drive of the pressure pulse source, these reflected pulses are superimposed with subsequently generated pressure pulses, and thereby further contribute to the increase in the wavefront amplitude and thus further contribute to increased pressure generation.

Preferably, an electrically contacted piezoceramic transducer is provided as the aforementioned backing, which, together with the piezoelectric foils and/or layers, is driveable according to the traveling wave principle. Although a passive (i.e., non-driven) acoustically hard backing can be used, by using an active (i.e., driven) acoustically hard backing such as a piezoceramic transducer, and active contribution to the pressure increase is also delivered, in addition to the contribution made by the reflected pulses. In a preferred version of this embodiment, the end face of the acoustically hard backing facing away from the foil arrangement is acoustically coupled to, such as by being directly adjacent, an acoustic absorber. This prevents pressure pulses having a polarity opposite to the pressure pulses generated by the piezoelectric foils (and by the backing if it is an active backing) from being introduced into the acoustic propagation medium as a consequence of acoustically soft reflection at the end face of the backing which faced away from the foil arrangement.

The piezoelectric foils are preferably piezoelectrically activated polymer foils, such as polyvinylidene fluoride (PVDF) foils. Lead-zirconate-titanate is particularly suited as material for the backing if it is an active backing in the form of a piezoceramic transducer. Brass is particularly suitable for use as the acoustic absorber.

As noted above, the respective end faces of the piezoelectric foils can be provided with an electrode for electrical contacting, with the respective end faces of adjacent foils or layers having the same polarity being pressed against each other. If an active backing is used in the form of a piezoceramic transducer, the piezoceramic transducer can also have its end faces respectively provided with an electrode for electrical contacting, with the electrode of the piezoelectric foil or layer which faces the piezoceramic transducer having the same polarity as the electrode of the piezoceramic transducer which it faces and is pressed against. As noted above, insulating measures between the elements, including the foil or layer and the piezoceramic transducer, which are adjacent one another are not needed, so that acoustic losses caused by insulating layers as a consequence of attenuation are avoided. The same advantage in reducing the wiring outlay is also present in embodiments having an active backing, with the number of electrical lines from the drive source to the driven elements (i.e., the foils or layers, plus the active backing) being equal to the number of such driven elements, plus one.

DESCRIPTION OF THE PREFERRED EMBODIMENTS

Figure 1:
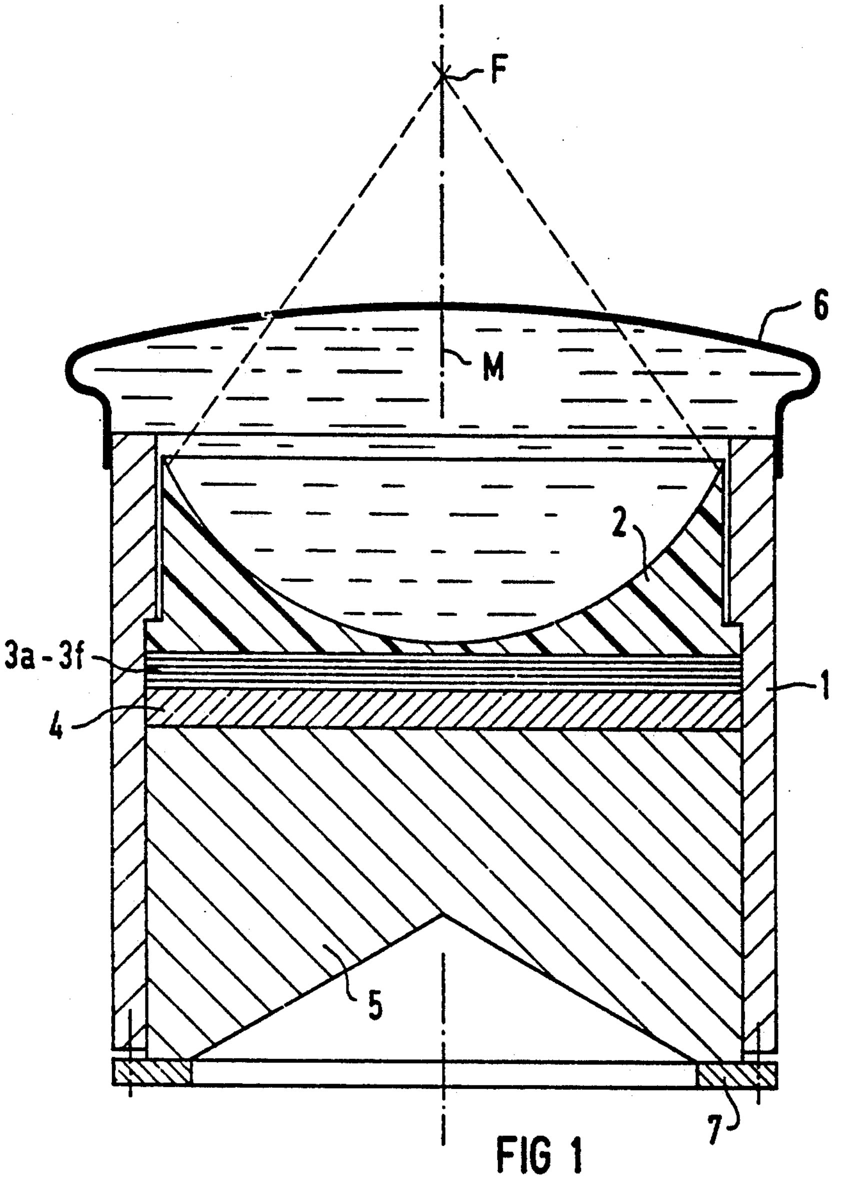
FIG. 1 shows a pressure pulse source operating according to the traveling wave principle constructed in accordance with the principles of the present invention, in a schematically illustrated longitudinal section.

The pressure pulse source constructed in accordance with the principles of the present invention as shown in FIG. 1 includes a cylindrical tubular housing 1 in which a plano-concave acoustic positive lens 2 and a foil arrangement are disposed. The foil arrangement in the exemplary embodiment of FIG. 1 is formed by six piezoelectric foils 3*a* through 3*f* of identical thickness, stacked directly on top of each other with no interstices therebetween. A piezoceramic transducer 4 and an acoustic absorber 5 are also contained in the housing 1. The housing 1 has an application end which is closed by a flexible membrane 6 with the volume defined by the flexible membrane 6 and the concave side of the positive lens 2 being filled with an acoustic propagation medium, such as water. The entire arrangement is substantially rotationally symmetrical relative to a center axis M.

The piezoelectric foils 3*a* through 3*f* are respectively polarized in the direction of their thickness, and are preferably piezoelectrically activated polymer foils, such as PVDF foils. The piezoceramic transducer 4 consists of a ceramic material which is acoustically hard in comparison to the material comprising the piezoelectric foils 3*a* through 3*f*, i.e., the material of the piezoceramic transducer has a higher acoustic impedance than that of the piezoelectric foils 3*a* through 3*f*. The piezoceramic transducer 4 may consist, for example, of lead-zirconate-titanate. The acoustic absorber 5 consists of a material having an acoustic impedance roughly corresponding to that of the material of the piezoceramic transducer 4, and which has a high acoustic attenuation. If the piezoceramic transducer 4 is formed by lead-zirconate-titanate material, the acoustic absorber 5 may, for example, consist of brass.

The thickness of each piezoelectric foil 3*a* through 3*f* is in the range, for example, 40 μm through 4 mm, and the thickness of the piezoceramic transducer 4 is in the range of 2 through 20 mm.

The pressure pulses exiting from the foil arrangement are planar pressure pulses, and the positive lens 2 serves the purpose of focusing these planar pressure pulses onto a focal zone lying on the middle axis M of the arrangement. The center of this focal zone is referenced F.

The foil arrangement formed by the piezoelectric foils 3*a* through 3*f* has one end face which presses against the planar side of the acoustic positive lens 2. The other end face of the foil arrangement presses against the piezoceramic transducer 4, which is in the form of a wafer having end faces in respective parallel planes. The end face of the piezoceramic transducer 4 which faces away from the foil arrangement presses against one end face, which is a planar end face, of the acoustic absorber 5. The opposite end face of the acoustic absorber 5 has a conical depression or recess, for reasons described below.

The positive lens 2, the foil arrangement formed by the piezoelectric foils 3*a* through 3*f*, the piezoceramic transducer 4 and the acoustic absorber 5 are clamped liquid-tight against a shoulder of the housing 1 by a retaining ring 7 and a plurality of screws (only the center lines of two such screws being schematically indicated in FIG. 1), so that the end faces of each of these components which face other are pressed flush against one another. As a result of the end faces being pressed flush against each other, good acoustic coupling from component-to-component is achieved. It is also possible to glue the respective end faces of adjacent components to each other using a thin adhesive layer. This is particularly suitable for the piezoelectric foils 3*a* through 3*f* since the foil arrangement, possibly in combination with the piezoceramic transducer 4 also glued thereto, then constitutes a unitary structure which is easy to manipulate.

Figure 2:
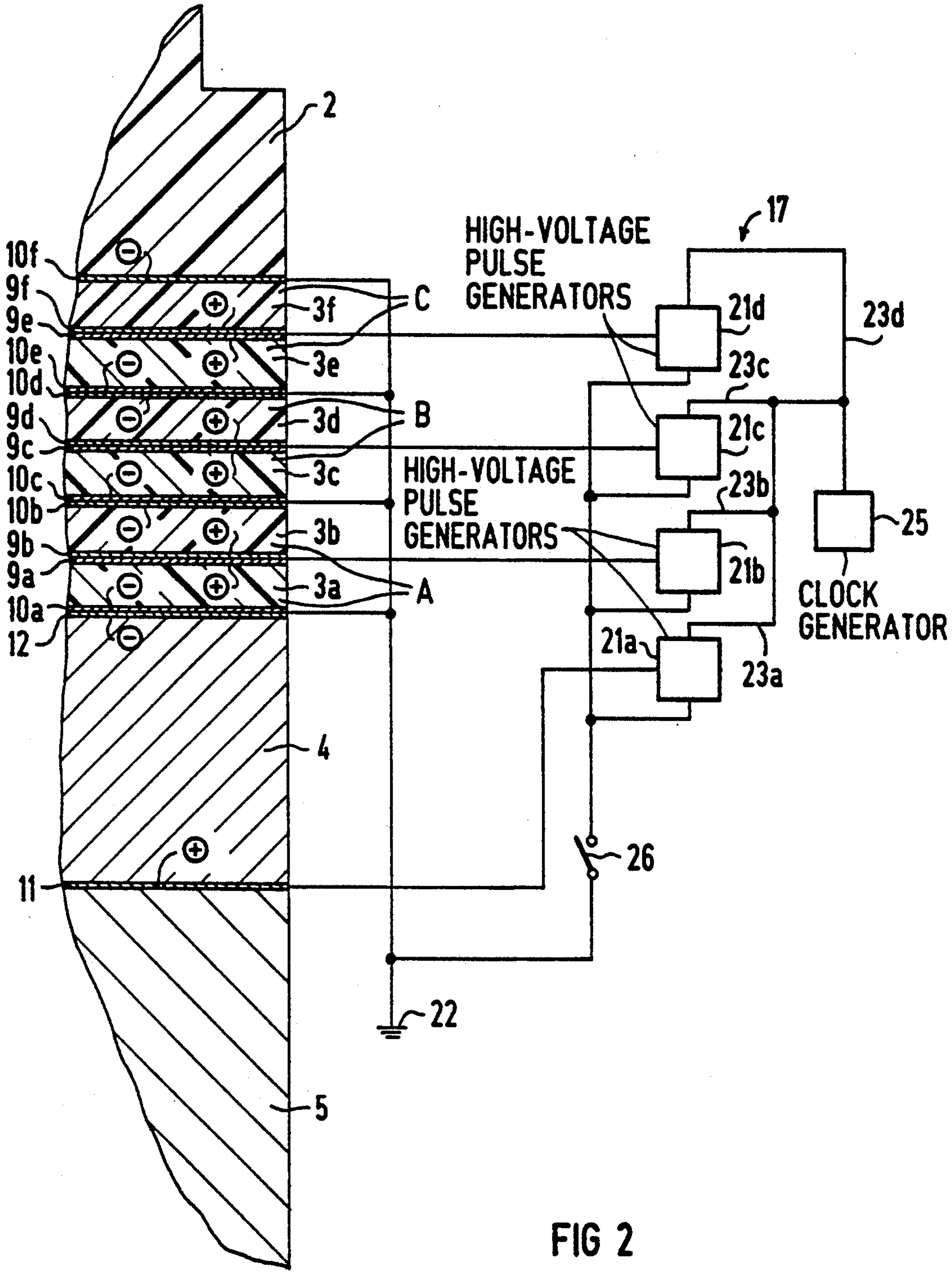
FIG. 2 shows an enlarged detail of a portion of the pressure pulse source of FIG. 1, connected to a drive system.

As can be seen in FIG. 2, each piezoelectric foils 3*a* through 3*f* has a positive electrode, respectively referenced 9*a* through 9*f*, and a negative electrode, respectively referenced 10*a* through 10*f*. The piezoceramic transducer 4 has a positive electrode 11 and a negative electrode 12. The piezoelectric foils 3*a* through 3*f* are stacked within the foil arrangement so that piezoelectric foils which are adjacent are pressed against each other with electrodes of the same polarity. The piezoceramic transducer 4 and the piezoelectric foil 3*a* of the foil arrangement adjacent thereto are also pressed against one another with electrodes of the same polarity.

The electrodes 9*a* through 9*f*, 10*a* through 10*f*, 11 and 12 are formed by metallizing the end faces of the foils 3*a* through 3*f* and the piezoelectric transducer 4. The thickness of the electrodes, which is shown exaggerated in FIG. 2, is at least one order of magnitude smaller than the thickness of the piezoelectric foils 3*a* through 3*f*, or of the piezoceramic transducer 4.

The positive electrode pairs 9*a* and 9*b*, 9*c* and 9*d*, and 9*e* and 9*f* which press against each other as well as the positive electrode 11 of the piezoceramic transducer 4, are respectively connected to high-voltage pulse generators 21*a* through 21*d*, which form a part of a drive circuit 17. The high-voltage pulse generators 21*a* through 21*d* each have a trigger input. These trigger inputs are each connected to a clock generator 25 via respective trigger lines 23*a* through 23*d*. The clock generator 25 supplies a square-wave signal having a constant cycle to each of the pulse generators 21*a* through 21*d*, thereby causing each of those pulse generators to generate one a high-voltage pulse per square-wave clock pulse, for example, at the appearance of the leading edge of the square-wave clock pulse. The negative electrodes 10*a* through 10*f* and 12 are connected in common to a reference potential, for example ground potential 22.

In the above-described structure, two piezoelectric foils, such as the foils 3*a* and 3*b*, 3*c* and 3*d*, and 3*e* and 3*f* are driven in common and in the same direction to generate a pressure pulse. The piezoelectric foil pairs 3*a* and 3*b*, 3*c* and 3*d*, and 3*e* and 3*f* which are operated together thus behave as a single piezoelectric foil in terms of their frequency behavior, and having a thickness corresponding to the combined thickness of the foils comprising the pair. The foil arrangement thus has three layers A, B and C which can be driven to generate pressure pulses, layer A being formed by the piezoelectric foils 3*a* and 3*b*, layer B being formed by piezoelectric foils 3*c* and 3*d* and layer C being formed by piezoelectric foils 3*e* and 3*f*.

The cycle of the square-wave signal generated by the clock generator 25 is such that it exactly corresponds to the transit time of a pressure pulse through one of the layers A through C. Consequently, the high-voltage pulse generators 21*a* through 21*d* each supply a sequence of high-voltage pulses $I_1$ through $I_n$. As a consequence of the triggering of all high-voltage pulse generators 21*a* through 21*d* by the same trigger signal, the high-voltage pulses supplied to the layers A through C and to the piezoceramic transducer 4 are separated from one another by a chronological duration which is equal to the transit time of a pressure pulse through one of the layers A through C. The high-voltage pulse generators 21*a* through 21*d* are thus synchronized, so that all of the high-voltage pulse generators 21*a* through 21*d* simultaneously deliver a high-voltage output pulse in the sequence. Upon the simultaneous appearance of these trigger pulses at each of the layers A through C and at the piezoceramic transducer 4, each of those layers A through C and the piezoceramic transducer 4 is simultaneously excited so as to generate a pressure pulse. More precisely, the layers A through C and the piezoceramic transducer 4, when excited by a high-voltage pulse, each generate a planar pressure pulse propagating in the direction toward the positive lens 2 as well as a planar pressure pulse propagating in the direction toward the acoustic absorber 5.

Considering, for example, the pressure pulse emitted by the piezoceramic transducer 4 in the direction toward the positive lens 2 given the occurrence of a high-voltage pulse $I_1$ supplied by the high-voltage pulse generator 21*a*, this pressure pulse will emerge from the layer A simultaneously with that pressure pulse from the layer A which the layer A is caused to generate when it is driven by the high-voltage pulse generator 21*b* by the next high-voltage pulse $I_2$. The pressure pulse generated by the piezoceramic transducer 4 as a consequence of the high-voltage pulse $I_1$ is thus superimposed, in the sense of a pressure increase, with the pressure pulse generated by the layer A as a consequence of the high-voltage pulse $I_2$. This pressure pulse formed by superimposition, in turn, emerges from the layer B simultaneously with that pressure pulse generated by the layer B as a consequence of being excited by the next high-voltage pulse $I_3$, supplied by the high-voltage pulse generator 21*c*. Consequently the pressure pulse generated by the layer B is superimposed with the pressure pulse which arose by superimposition of the pressure pulse generated by the piezoceramic transducer 4 as a consequence of the high-voltage pulse $I_1$ and the pressure pulse generated by the layer A as a consequence of the high-voltage pulse $I_2$. It thus clear that, after the appearance of the high-voltage pulse $I_4$, that a pressure pulse emerges from the layer C which has arisen by "addition" of all the pressure pulses which were generated by the piezoceramic transducer 4 as a consequence of the high-voltage pulse $I_1$, by the layer A as a consequence of the high-voltage pulse $I_2$, by the layer B as a consequence of the high-voltage pulse $I_3$, and by the layer C as a consequence of the high-voltage pulse $I_4$. This result also arises for the sequences of high-voltage pulses $I_2$ through $I_5$, $I_3$ through $I_6$, etc., through $I_{n-3}$ through $I_n$.

Considering the pressure pulses emitted by the layers A through C in the direction toward the acoustic absorber 5, it can be seen that as a consequence of the piezoceramic transducer 4 being acoustically hard in comparison to the material of the piezoelectric foils 3*a* through 3*f*, these pulses are reflected at the boundary surface between the piezoelectric foil 3*a* (also forming the boundary surface of the layer A) and the piezoceramic transducer 4. The degree of reflection (reflectivity) is dependent on the relationship of the acoustic impedances of the materials of the piezoelectric foils 3*a* through 3*f* and the piezoceramic transducer 4 and becomes higher as the difference between these acoustic impedances increases. The pressure pulse emitted by the layer A in the direction toward the acoustic absorber 5 as a consequence of the high-voltage pulse $I_3$, for example, following reflection at the boundary surface of the piezoceramic transducer 4, emerges from the layer A propagating in the direction toward the positive lens 2 precisely at the time when a further pressure pulse is generated by driving the layer A with the high-voltage pulse $I_4$. Superimposition of those occurs. Simultaneously with these pressure pulses, those pressure pulses respectively emitted by the layer B (as a consequence of the high-voltage pulse $I_2$) and the layer C (as a consequence of the high-voltage pulse $I_1$) in the direction toward the acoustic absorber 5 are reflected at the boundary surface of the piezoceramic transducer 4 and emerge from the layer A. This sequence occurs for each of the groups of high-voltage pulses $I_2$ through $I_5$, $I_3$ through $I_6$, etc. A superimposition of the pressure pulses emitted by the piezoelectric foils 3*a* through 3*f*, or by the layers A through C, in the direction of the acoustic absorber 5 thus also arises in the sense of a pressure increase.

The pressure pulses emitted by the piezoceramic transducer 4 in the direction toward the acoustic absorber 5 are not utilized. As a consequence of the coinciding acoustic impedances of these two components, these pressure pulses proceed into the acoustic absorber 5 essentially without the occurrence of reflections and, to the extent these pressure pulses are not converted into heat as a consequence of the attenuation of the material of the acoustic absorber 5, are reflected at the rear side of the acoustic absorber 5. Because this rear side of the acoustic absorber 5 is adjacent ambient air, which is acoustically softer than the material of the acoustic absorber 5, a phase shift occurs upon this reflection, so that the components of the pressure pulses reflected at the rear side of the acoustic absorber 5 have a polarity opposite that of the pressure pulses generated by the pressure pulse source. A significant attenuation of the pressure pulses generated by the pressure pulse source in the direction toward the acoustic lens 2, due to the pressure pulse components reflected at the rear side of the acoustic absorber 5, will not arise because the pressure pulse components reflected at the rear of the acoustic absorber 5 will diverge due to the conical recess in the rear side of the acoustic absorber 5. These reflected components can therefore only be imperfectly focused by the positive lens 2. It is clear that those parts of the pressure pulses emitted by the piezoelectric layers A through C in the direction toward the acoustic absorber 5, which are not reflected as a consequence of incomplete reflection at the boundary surface of the piezoceramic transducer 4, proceed into the acoustic absorber 5. The same circumstances apply to those pressure pulses as was described above for the pressure pulses emitted in that direction by the piezoceramic transducer 4.

Minor losses may arise due to the attenuation of the pressure pulses when traversing the piezoelectric foils 3*a* through 3*f* and as a consequence of incomplete reflection at the boundary surface of the piezoceramic transducer 4. Leaving these minor losses out of consideration, it is clear that the pressure of the pressure pulses emitted by the pressure pulse source in the direction toward the positive lens 2 corresponds to twelve times the pressure of a pressure pulse emitted by one piezoelectric foil, plus the increase in pressure caused by the pressure pulses emitted by the piezoceramic transducer 4. In comparison to known acoustic pressure pulse sources operating according to the traveling wave principle, a significant pressure increase is achieved not only by stacking the piezoelectric foils 3*a* through 3*f* directly on each other with no intervening, attenuating liquid propagation paths, but also by using the piezoceramic transducer 4, in addition to its function as a backing so as to maximally exploit the pressure pulses emitted by the piezoelectric foils 3*a* through 3*f* in the direction toward the acoustic absorber 5, to actively contribute to increasing the pressure by driving the piezoceramic transducer 4 to generate pressure pulses.

As schematically shown in FIG. 2, it is possible to switch the polarity of the high-voltage pulses generated by the high-voltage pulse generators 21*a* through 21*d* by means of a switch 26, so that positive pressure pulses in comparison to ambient pressure or negative pressure pulses in comparison to ambient pressure can be generated, dependent on the position of the switch 26.

Figure 3:
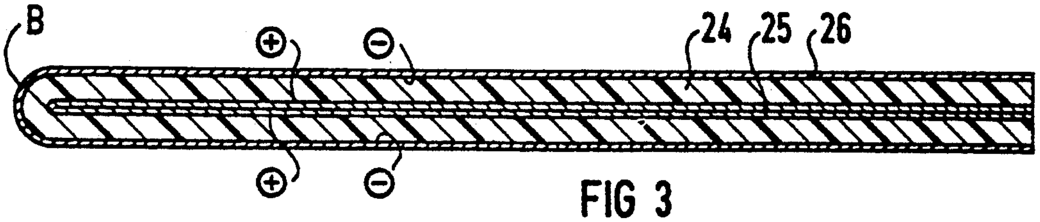
FIG. 3 is an enlarged side sectional view of an embodiment of one piezoelectric layer in the pressure pulse source of FIGS. 1 and 2.

A further embodiment of a layer structure, using layer B as an example, is shown in FIG. 3. In this embodiment, layer B is composed of a single piezoelectric foil 24, which is folded in a U-shape so that the two legs of the layer B press each other at the positive electrode 25. The negative electrode 26 covers the two outer end faces of the folded layer B, as well as the curved exterior of the fold. Such a structure is referred to herein as a bilaminar structure. The same structure can be employed for layers A and C.

It will be understood that it is possible to employ a single high-voltage pulse generator for all of the layers A through C and for the piezoelectric transducer 4. If such a single generator is used, however, it must be assured by appropriate dimensioning that the single generator can deliver the high-voltage pulses of the required amplitude with the necessary repetition rate.

It is also theoretically possible to individually drive the piezoelectric foils 3*a* through 3*f*. If this is done, however, it would be necessary to electrically insulate the respective adjacent faces of the foils from foil-to-foil, and to electrically insulate the piezoelectric transducer 4 from the piezoelectric foil 3*a*. In such an arrangement, however, there would be the risk that parasitic capacitances formed by adjacent piezoelectric foils and the insulating layers therebetween would significantly exceed the capacitances of the individual piezoelectric foils, with the result that an optimum functioning of the pressure pulse source is no longer ensured.

The electrical contacting of the layers A through C can ensure, for example, by placing a metal foil strip between the electrodes to be contacted, for example between electrodes 10*d* and 10*e*. If an adhesive is present between the electrodes, it must be assured that this adhesive does not insulate the metal foil strips from the electrodes. Correspondingly, a metal foil strip can be disposed between the acoustic absorber 5 and the electrode 11 of the piezoceramic transducer 4, between the electrode 10*f* and the positive lens 2, or between the two legs of a layer, such as the layer B, in the embodiment of FIG. 3.

The pressure pulse source disclosed herein particularly suited for medical purposes, for example for treating tumor and stone pathologies. Using a known x-ray and/or ultrasound locating system, the flexible membrane 6 of such a pressure pulse source is pressed against the body surface of a patient to be treated, with the pressure pulse source being positioned so that tumor or the calculus to be treated is located in the focal zone of the pressure pulse generated by the pressure pulse source. The region to be treated is then charged in the required manner with pressure pulses, with negative pressure pulses being employed when treating tumor pathologies and positive pressure pulses being preferably employed when treating stone pathologies. The pressure pulse source disclosed herein, however, can also be utilized for non-medical purposes.

Although modifications and changes may be suggested by those skilled in the art, it is the intention of the inventors to embody within the patent warranted hereon all changes and modifications as reasonably and properly come within the scope of their contribution to the art.

We claim as our invention:

1. A pressure pulse source for generating acoustic pressure pulses in an acoustic propagation medium comprising:

a foil arrangement of a plurality of electrically contacted, piezoelectric foils stacked directly on top of one another with no interstices therebetween;

said foil arrangement having a first end face from which said pressure pulses emerge, and an opposite end face, and a backing, consisting of a piezoceramic transducer having electrical contacts, disposed against said opposite end face of said foil arrangement; and means for driving said piezoelectric foils and said piezoceramic transducer according to the traveling wave principle for causing each of said piezoelectric foils and said piezoceramic transducer to produce acoustic waves for generating pressure pulses.

2. A pressure pulse source as claimed in claim 1 wherein said foils of said foil arrangement are electrically connected to form a plurality of layers, and wherein said means for driving is a means for driving said layers according to the traveling wave principle.

3. A pressure pulse source as claimed in claim 2 wherein each of said piezoelectric foils has an end face provided with an electrode, and wherein at least one of said layers is formed by two of said piezoelectric foils/-lie against each other with electrodes having the same polarity, and wherein each of said layers/lies against an adjacent layer with electrodes having the same polarity.

4. A pressure pulse source as claimed in claim 2 wherein each of said piezoelectric foils has an end face with an electrode, wherein at least one of said layers is formed by a bilaminarly folded piezoelectric foil, and wherein said layers/lie against each other with electrodes of the same polarity.

5. A pressure pulse source as claimed in claim 1 wherein each of said piezoelectric foils of said foil arrangement has the same thickness.

6. A pressure pulse source as claimed in claim 1 wherein said foil arrangement has a first end face from which said pressure pulses emerge, and an opposite end face, and wherein said pressure pulse source further comprises a backing disposed against said opposite end face of said foil arrangement, said backing consisting of a material which is acoustically hard in comparison to said piezoelectric foils.

7. A pressure pulse source as claimed in claim 6 wherein said backing consists of a piezoceramic transducer having electrical contacts, and wherein said means for driving is a means for driving said piezoelectric foils and said piezoceramic transducer according to the traveling wave principle for generating pressure pulses.

8. A pressure pulse source as claimed in claim 1 wherein said piezoceramic transducer consists of lead-zirconate-titanate material.

9. A pressure pulse source as claimed in claim 1 wherein said piezoceramic transducer is pressed against one of said piezoelectric foils forming said opposite end face of said foil arrangement with electrodes of the same polarity.

10. A pressure pulse source as claimed in claim 1 wherein said backing has an end face facing away from said foil arrangement, and said pressure pulse source further comprising an acoustic absorber disposed adjacent said end face.

11. A pressure pulse source as claimed in claim 10 wherein said acoustic absorber consists of brass.

12. A pressure pulse source as claimed in claim 1 wherein said piezoelectric foils consist of piezoelectrically activated polymer foils.

13. A pressure pulse source as claimed in claim 12 wherein said piezoelectrically activated polymer foils consist of polyvinylidene fluoride.

14. A pressure pulse source for generating acoustic pressure pulses in a propagation medium comprising:

a foil arrangement of a plurality of electrically contacted, piezoelectric foils, each driveable produce an acoustic wave, stacked directly on one another with no interstices therebetween;

said foil arrangement having a first end face from which said pressure pulse emerge, and an opposite end face, and a backing, consisting of a piezoceramic transducer having electrical contacts, disposed against said opposite end face of said foil arrangement; and means for individually driving each of said piezoelectric foils and said piezoceramic transducer with a sequence of high-voltage pulses, each high-voltage pulse in said sequence being simultaneously supplied to all of said piezoelectric foils and piezoceramic transducer, for causing each of said piezoelectric elements and piezoceramic transducer to generate respective acoustic waves which additively superimpose to form an output pressure pulse.

15. A pressure pulse source as claimed in claim 14 wherein said output pulse emerges from an end face of one of said piezoelectric foils at an end of said stacked piezoelectric foils.

16. A pressure pulse source as claimed in claim 2 wherein each of said layers of said foil arrangement has the same thickness.

17. A pressure pulse source as claimed in claim 1 wherein each of said piezoelectric foils has an end face with an electrode, and wherein said piezoelectric foils engage each other with electrodes of the same polarity.

18. A pressure pulse source as claimed in claim 1 wherein at least one of said electrical contacts of said piezoceramic transducer is an electrode disposed on an endface of said piezoceramic transducer, wherein a further electrode is disposed on said opposite end face of said foil arrangement, and wherein said piezoceramic transducer engages said foil arrangement such that said electrode of said piezoceramic transducer contacts said further electrode, said electrode of said piezoceramic transducer and said further electrode having the same polarity.

19. A pressure pulse source as claimed in claim 7 wherein said piezoceramic transducer consists of lead-zirconate-titanate material.

20. A pressure pulse source as claimed in claim 7 wherein said piezoceramic transducer is pressed against one of said piezoelectric foils forming said opposite end face of said foil arrangement with electrodes of the same polarity.

21. A pressure pulse source as claimed in claim 6 wherein said backing has an end face facing away from said foil arrangement, and said pressure pulse source further comprising an acoustic absorber disposed adjacent said end face.

22. A pressure pulse source as claimed in claim 21 wherein said acoustic absorber consists of brass.

23. A pressure pulse source as claimed in claim 7 wherein at least one of said electrical contacts of said piezoceramic transducer is an electrode disposed on an end face of said piezoceramic transducer, wherein a further electrode is disposed on said opposite end face of said foil arrangement, and wherein said piezoceramic transducer engages said foil arrangement such that said electrode of said piezoceramic transducer contacts said further electrode, said electrode of said piezoceramic transducer and said further electrode having the same polarity.

* * * * *